United States Patent
Van Noort et al.

(10) Patent No.: US 7,741,182 B2
(45) Date of Patent: Jun. 22, 2010

(54) METHOD OF FABRICATING A DUAL GATE FET

(75) Inventors: Wibo Daniel Van Noort, Wappingers Falls, NY (US); Franciscus Petrus Widdershoven, Eindhoven (NL); Radu Surdeanu, Roosbeek (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/815,100

(22) PCT Filed: Jan. 23, 2006

(86) PCT No.: PCT/IB2006/050238

§ 371 (c)(1),
(2), (4) Date: Aug. 22, 2008

(87) PCT Pub. No.: WO2006/079964

PCT Pub. Date: Aug. 3, 2006

(65) Prior Publication Data

US 2008/0318375 A1 Dec. 25, 2008

(30) Foreign Application Priority Data

Jan. 28, 2005 (EP) ................. 05100571

(51) Int. Cl.
H01L 21/336 (2006.01)

(52) U.S. Cl. ............... 438/283; 438/157; 438/212; 257/E21.637; 257/E21.643

(58) Field of Classification Search ............... None
See application file for complete search history.

(56) References Cited

U.S. PATENT DOCUMENTS

| 6,716,684 | B1 * | 4/2004 | Krivokapic et al. ....... 438/157 |
| 7,078,299 | B2 * | 7/2006 | Maszara et al. .......... 438/285 |
| 2002/0003256 | A1 * | 1/2002 | Maegawa ............... 257/328 |
| 2003/0122186 | A1 * | 7/2003 | Sekigawa et al. ........ 257/316 |
| 2004/0145000 | A1 * | 7/2004 | An et al. ............... 257/270 |
| 2004/0169239 | A1 | 9/2004 | Rim |
| 2005/0001216 | A1 | 1/2005 | Adkisson et al. |
| 2005/0009305 | A1 | 1/2005 | Anderson et al. |
| 2005/0012145 | A1 | 1/2005 | Furukawa et al. |
| 2005/0077553 | A1 | 4/2005 | Kim et al. |

FOREIGN PATENT DOCUMENTS

EP 1091413 A2 4/2001

* cited by examiner

*Primary Examiner*—Thanh V Pham
*Assistant Examiner*—Andres Munoz

(57) ABSTRACT

The invention provides a method of fabricating an extremely short-length dual-gate FET, using conventional semi-conductor processing techniques, with extremely small and reproducible fins with a pitch and a width that are both smaller than can be obtained with photolithographic techniques. On a protrusion (2) on a substrate (1), a first layer (3) and a second layer (4) are formed, after which the top surface of the protrusion (2) is exposed. A portion of the first layer (3) is selectively removed relative to the protrusion (2) and the second layer (4), thereby creating a fin (6) and a trench (5). Also a method is presented to form a plurality of fins (6) and trenches (5). The dual-gate FET is created by forming a gate electrode (7) in the trench(es) (5) and a source and drain region. Further a method is presented to fabricate an extremely short-length asymmetric dual-gate FET with two gate electrodes that can be biased separately.

17 Claims, 6 Drawing Sheets

METHOD OF FABRICATING A DUAL GATE FET

Figure 1:
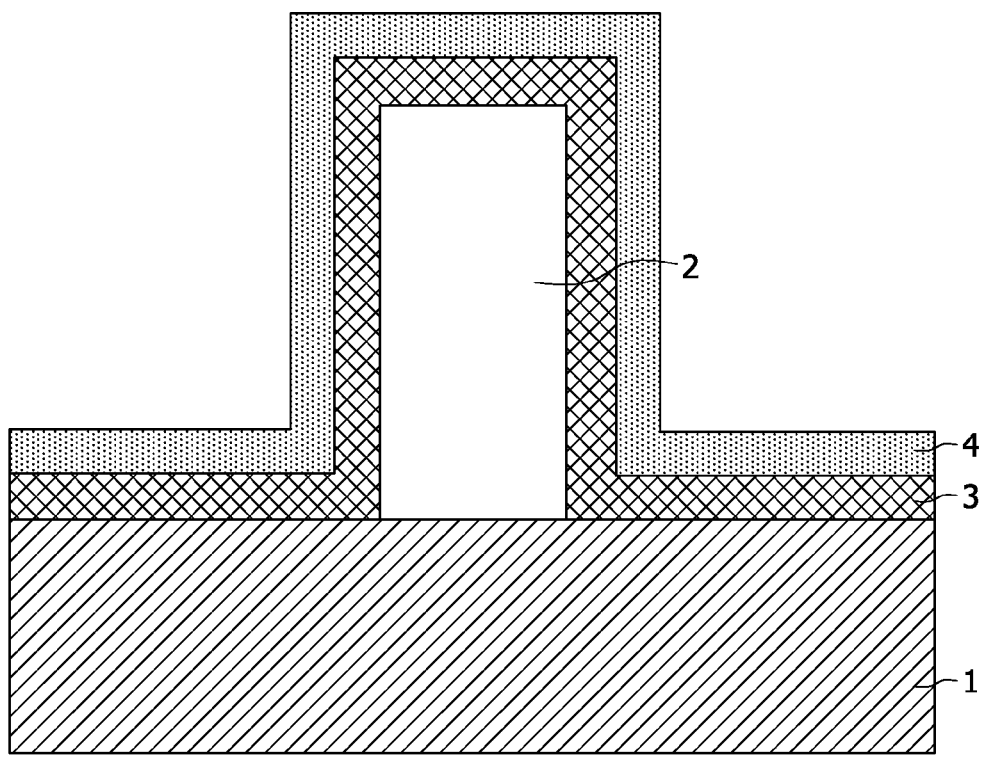

The invention relates to a method of fabricating a dual-gate FET.

EP 1 091 413 discloses a method of fabricating a dual-gate CMOS FET wherein a semiconductor substrate is provided with a plurality of pillars, which are formed with conventional photolithography and etching. A subtractive oxidation process reduces the width of the pillars thereby creating channel segments, which are laterally separated by spaces that have a width, which is smaller than the width that can be obtained with contemporary conventional photolithographic techniques. A gate structure is formed in the spaces between the channel segments, which is photolithographically patterned and etched to create the desired shape, and the source and drain areas are formed, thereby creating a fully-depleted and fully-inverted dual-gate CMOS FET with a plurality of vertically-extending channel segments and a gate structure with a plurality of vertically-oriented gate segments positioned between the channel segments.

In a fully depleted and fully inverted dual-gate CMOS FET, the width of the channel segments should be such that a fully depleted region in the channel segments can be created without significant influence from adverse short channel effects. To achieve this effect, the width of the channel segments should be smaller than can be obtained with contemporary photolithographic techniques. The method according to the prior art achieves this effect by a combination of three different conventional fabrications steps: the lithographic step, the reactive ion etching step and the subtractive oxidation step. However, it is difficult to reduce the width of the channel segments and at the same time control the reproducibility of this width. In other words, a smaller width of the channel segments, obtained by adapting the subtractive oxidation step, will cause a larger variation of this width, for example between different substrates. Ultimately the variation of the width of the channel segments will be unacceptable, and the minimum value of this width that can be achieved with this fabrication method, is reached. It is evident that, because of the large variation of the width of the channel segments, it is difficult to fabricate the channel segments having a width smaller than 10 nanometers with an acceptable reproducibility using the fabrication method of the prior art. Another disadvantage of the fabrication method of the prior art is that it is difficult to reduce the CMOS FET device area, because the pitch of the channel segments is defined by photolithography only. Therefore, scaling down the pitch of the channel segments, and hence reducing the device area, is determined by the limitations of photolithographic techniques, which is around 100 nanometer at the time of filing of this application.

It is an object of the invention to provide a method of fabricating a dual-gate FET, which is capable of forming extremely small, reproducible channel segments or fins with a pitch and a width which both are smaller than can be obtained with photolithographic techniques. According to the invention, this object is achieved by providing method for fabricating a FET as claimed in claim 1. The dependent claims define advantageous embodiments of the invention.

This fabrication method provides a fin with a width that is defined by the fabrication method that forms a second layer, which method allows forming a very thin conformal layer, for example several atomic layers, with a uniform thickness in a reproducible way without applying photolithographic techniques. The fabrication method of the prior art forms channel segments or fins that depend on photolithographic capabilities, thereby achieving a larger width, a worse uniformity and a worse reproducibility than the method of the invention. The extremely small, reproducible width of the fin of the invention enables to achieve a fully depleted and fully inverted channel behavior of the fin more easily. The invention provides a trench with a width that is determined by the fabrication method that forms a first layer, which method also allows forming a very thin conformal layer, for example several atomic layers, with a uniform thickness in a reproducible way. The spaces or trenches in the prior art have a larger width and a worse uniformity and reproducibility, because the trenches are defined by photolithography and subtractive oxidation, thereby increasing the width of the trenches beyond dimensions that can be obtained with contemporary photolithography.

Another advantage of the invention is the high aspect ratio of the trench and the fin, meaning that the depth of the trench and the height of the fin can be much larger than the width of the trench and the width of the fin. With the invention an aspect ratio of the trench and fin of ten or more can be achieved, hence having a trench depth and fin height that is at least ten times larger than the width of the trench and the width of the fin. The current drive of the FET is determined by, amongst others, the number of fins and the height of the fins. Therefore the invention provides a FET, which achieves a high current drive, while the device area is smaller than can be achieved with the prior art.

Another embodiment of the method of fabricating a FET according to the invention comprises forming at least one multi-layer structure comprising a layer of the first material and a layer of the second semiconductor material after forming of the second layer. Thereafter the step of removing the first and the second layer further comprises the removal of the multi-layer and the step of selectively removing the first material further comprises forming at least two trenches between the layers of the second semiconductor material and at least two fins adjoining the trenches. The forming of the multi-layer can be repeated, thereby creating a plurality of fins separated by trenches. The pitch of the fins is defined by the fabrication method that forms reproducible conformal layers with a uniform thickness and is determined by the sum of the thickness of the first and the second layer. Hence the pitch of the fins in the invention may be smaller than can be obtained with the fabrication method of the prior art, which method results in a pitch of the channel segments that is defined by photolithographic techniques. Because the pitch of the fins determines the total FET device area, the advantage of the invention is that a smaller FET device area can be achieved with the same electrical performance, or that a higher current drive can be achieved for the same FET device area.

A further embodiment comprises the step of providing dopant atoms to the first and the second semiconductor material after the selective removal of the first material. By providing dopant atoms in the fin before forming the insulation layer, the conductivity characteristics of the fin may be changed appropriately.

A further embodiment comprises the step of providing a layer of implanted material in the bottom surface of the trench and in the top surface of the fin and the protrusion. This implanted layer may be used to adjust the conductivity characteristics of the bottom surface of the trench and the top surface of the protrusion and the fin, thereby reducing the influence of surface parasitic transistors on the device performance and leaving only the dual-gated fin as the primary conducting path.

Another embodiment of the invention comprises the forming of a FET with two gate electrodes which may be biased separately and which may comprise different materials. After forming of the fins and trenches, a first insulation layer is formed on the exposed surfaces of the fins and the protrusion, after which a first conductive material is formed on the first insulation layer. Next, the first conductive material and the first insulation layer are removed to expose the top surface of the protrusion, thereby creating a first portion of the first conductive material which is in the trenches and a second portion of the first conductive material which is in a region outside the trenches, wherein the first portion has no connection with the second portion. Next, the protrusion, the first portion of the first conductive material and the first insulation layer in the trenches are removed, thereby creating a space between the fins and forming a first gate electrode in the region outside the trenches, comprising the second portion of the first conductive material. At this point the first gate electrode covers one side of the fins and the space is located at the opposite side of the fins. A second insulation layer is formed on the exposed surface of the fins in the space, after which a second conductive material is formed on this second insulation layer, thereby forming a second gate electrode. At this point the first gate electrode is covering one side of the fins and the second gate electrode is covering the opposite side of the fins, thereby enabling each fin to be controlled by two separate gate electrodes. By patterning the gate electrode and adding source and drain regions, an asymmetric dual-gate FET is created with two gate electrodes, which can be biased separately and which may be made of a different material. The use of two independent gate electrodes, which may be biased separately, gives an extra degree of freedom in controlling the conductivity characteristics of the fin compared to the use of one gate electrode, which simultaneously controls both sides of the fin. Three digital levels may be formed in this FET, comprising no current, when both gate electrodes are biased such that the fin is in depletion mode, half of the maximum current, when one gate electrode sets one side of the fin in inversion mode, and the maximum current, when both gate electrodes set the total fin in inversion mode. This is especially beneficial in logic circuits, enabling the same logic performance with fewer transistors than in conventional circuits.

In a further embodiment a contact area to the second gate electrode may be created on the source or drain regions before forming the first insulation layer. This method of contacting the second gate electrode on the source and drain regions is less critical than contacting the second gate electrode in between the fins, because more area is available to form the contact.

Figure 3:
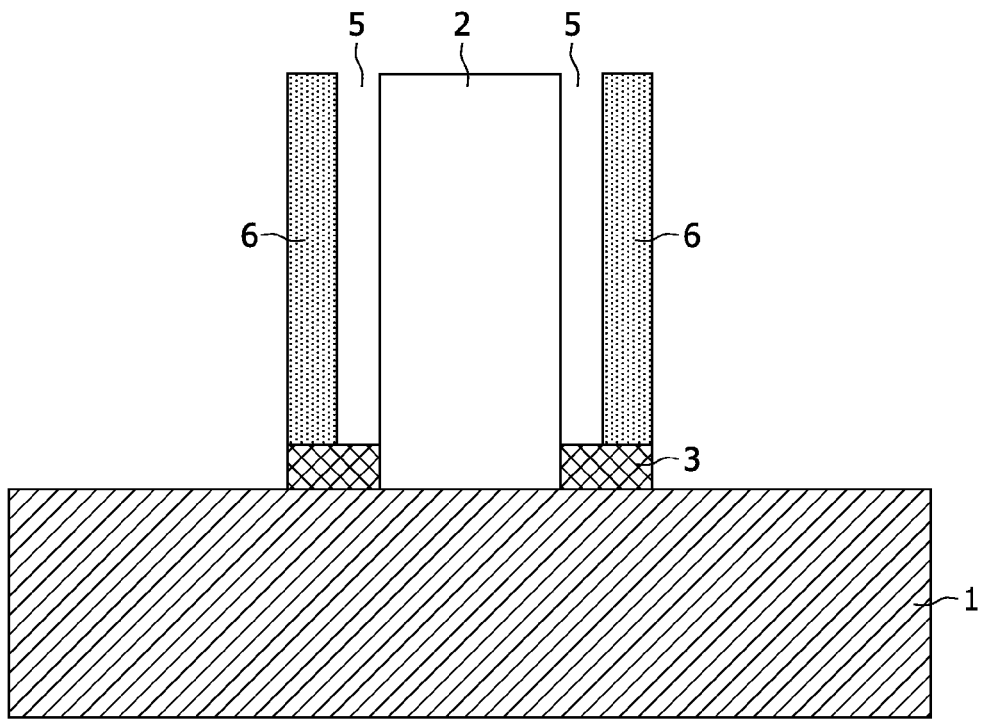
Figure 4:
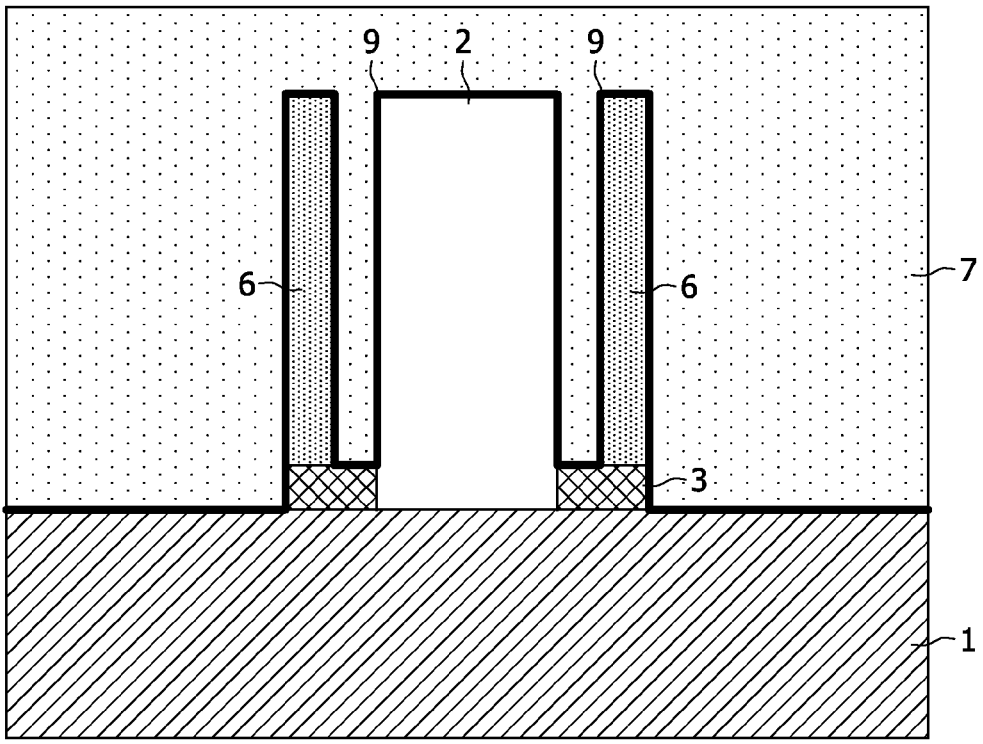
Figure 5:
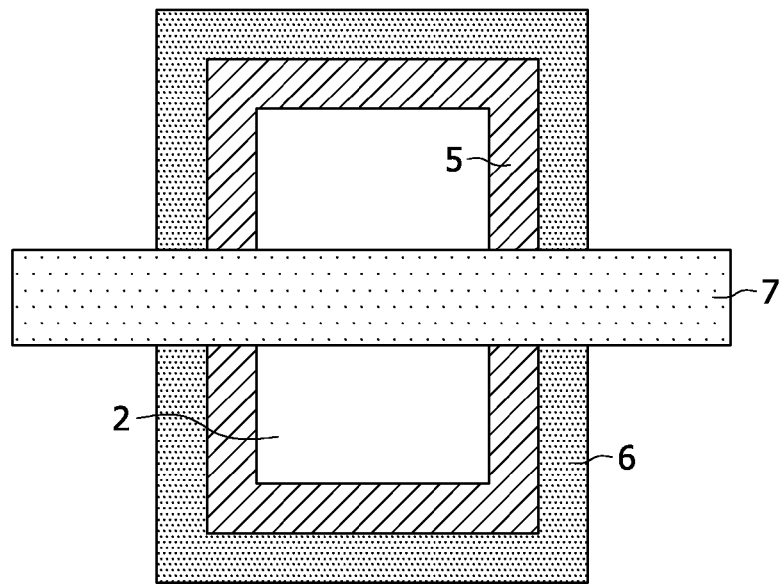
Figure 6:
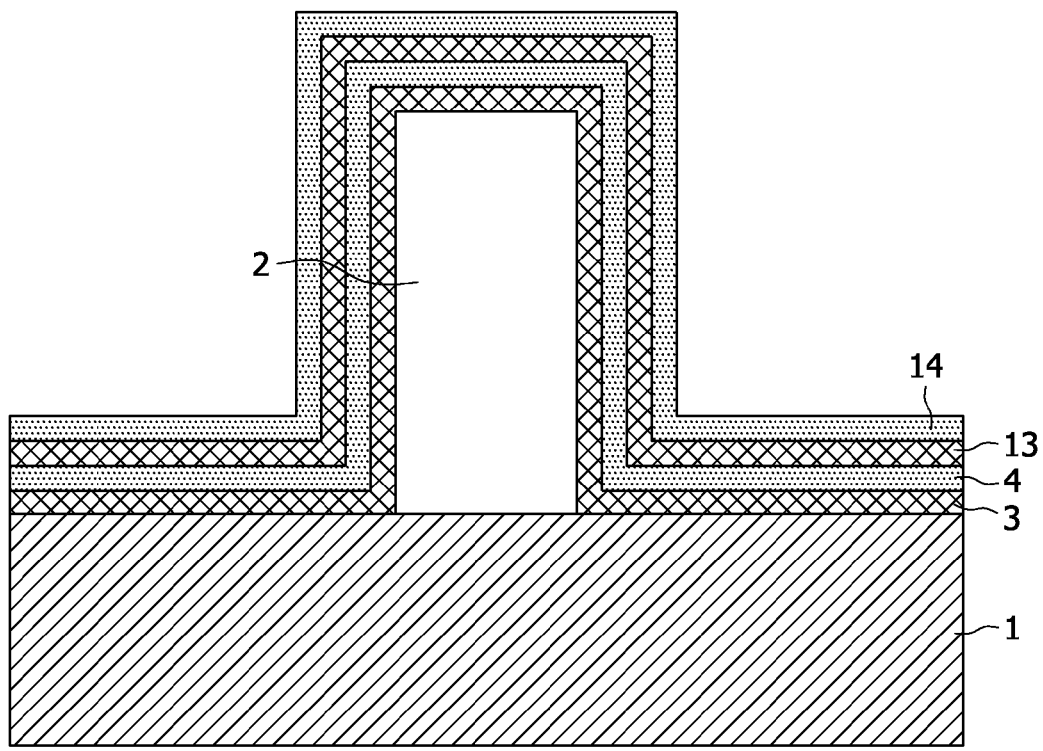
Figure 7:
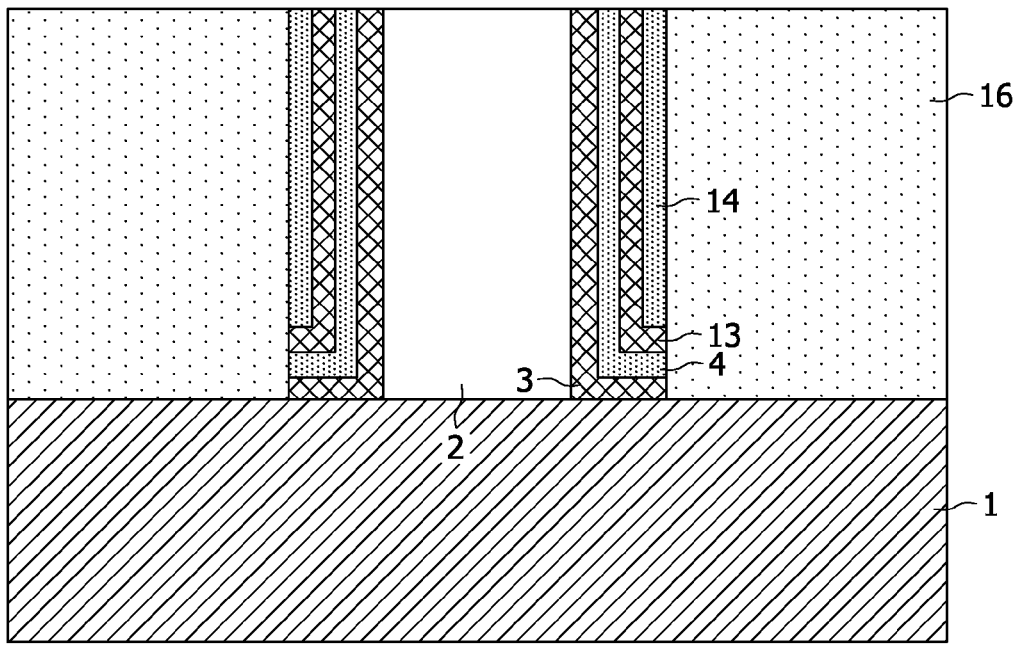
Figure 8:
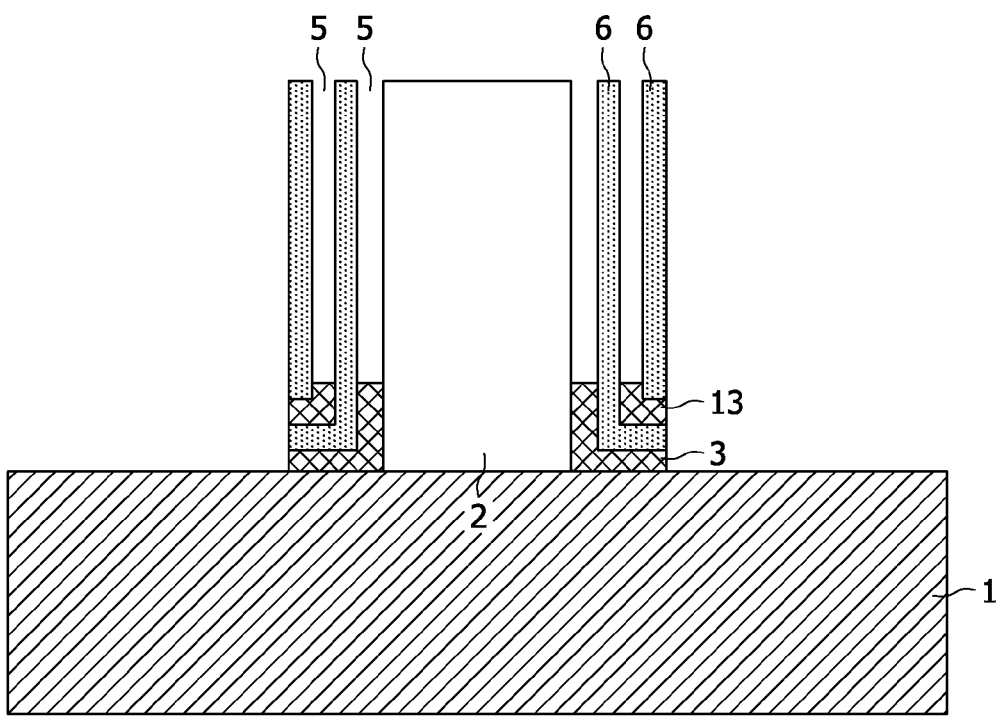
Figure 9:
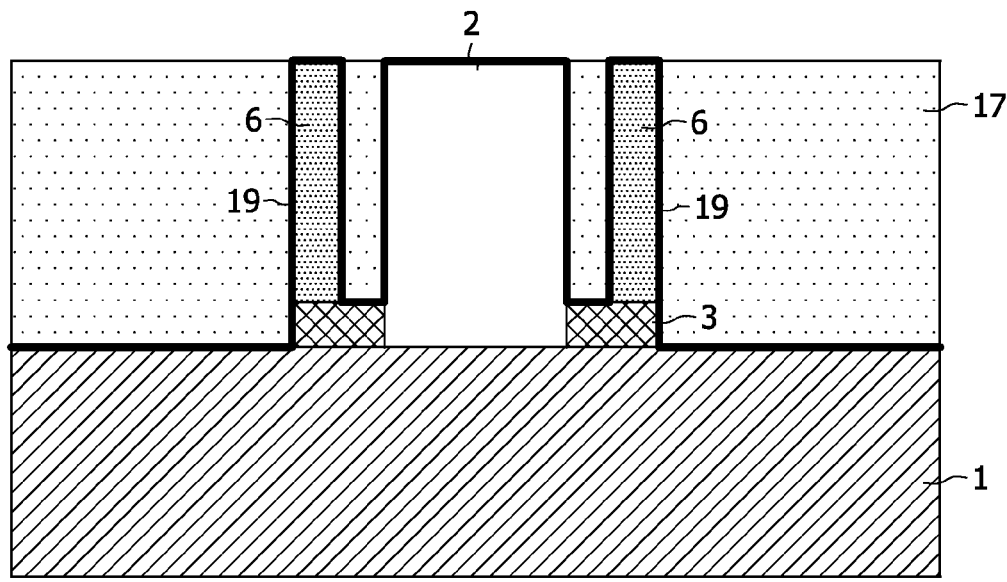
Figure 10:
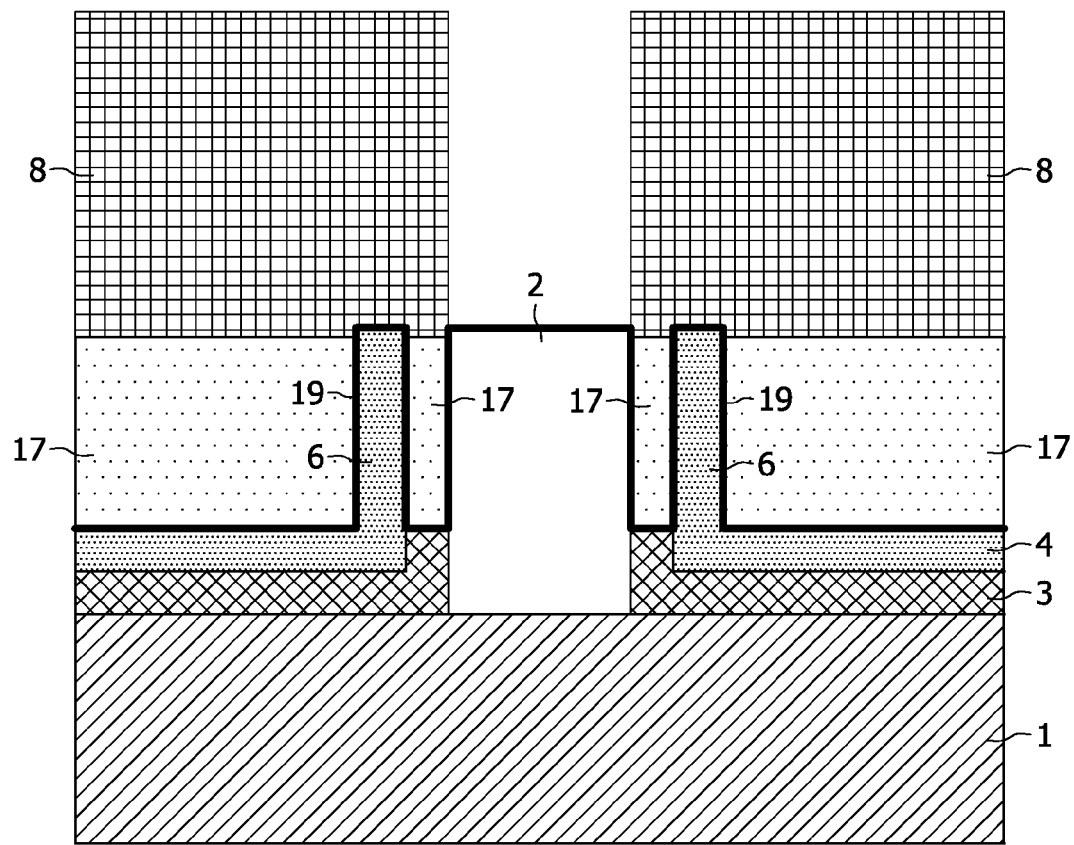
Figure 11:
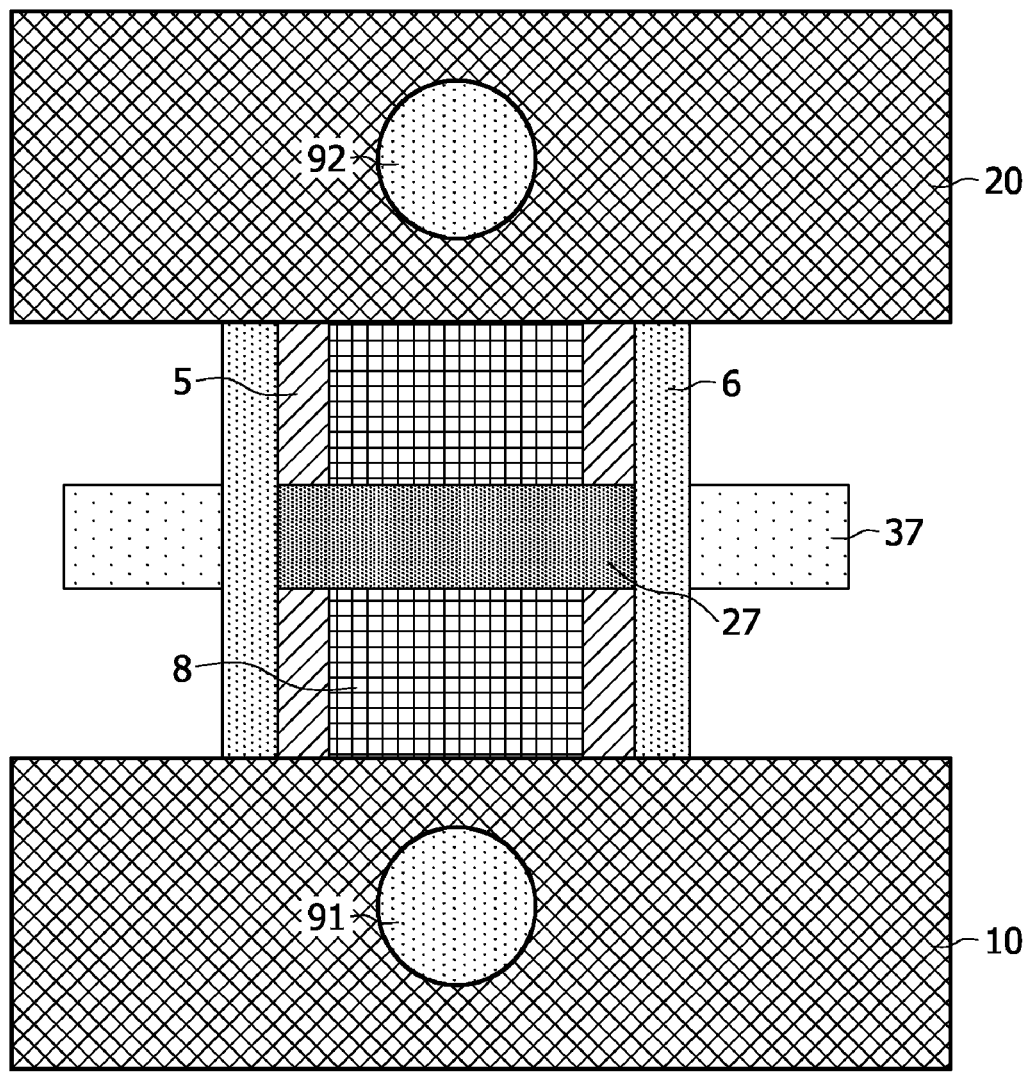

These and other aspects of the method of the invention will be further elucidated and described with reference to the drawings, in which:

FIGS. 1-4 are diagrammatic cross-sectional views illustrating the sequence of steps involved in fabricating a dual-gate FET, FIG. 5 is a diagrammatic top view of a dual-gate FET, FIGS. 6-8 are diagrammatic cross-sectional views illustrating the forming of a plurality of trenches and fins, FIGS. 9-10 are diagrammatic cross-sectional views illustrating the forming of an asymmetrical dual-gate FET, and FIG. 11 is a diagrammatic top view of an embodiment of the method of the invention, illustrating the forming of an asymmetrical dual-gate FET with contacts to the second gate electrode formed on the source and the drain regions.

The Figures are not drawn to scale. In general, identical components are denoted by the same reference numerals in the Figures.

FIG. 1 illustrates a cross-sectional view showing a substrate 1 with a protrusion 2, both comprising silicon, on which a SiGe layer 3, comprising a compound of silicon and germanium, and a silicon layer 4 are formed using epitaxial growth. In this embodiment the protrusion 2 has a rectangular shape, but other shapes may be possible, such as a triangle or a rectangle with a rounded top portion, wherein the protrusion 2 comprises sidewalls that extend mainly perpendicular from the substrate 1 and a top surface that connects the sidewalls. The protrusion 2 may also comprise another semiconductor material, such as SiGe, and the substrate 1 may also comprise a Silicon-On-Insulator (SOI) substrate with a buried silicon dioxide layer. The use of epitaxial growth results in conformal layers, which have a thickness that is very constant for the entire layer. Before forming of the SiGe layer 3 on the protrusion 2, a sacrificial oxide may be formed on the protrusion 2 and subsequently removed, to prepare the surface of the protrusion 2 for a conformal epitaxial growth.

Figure 2:
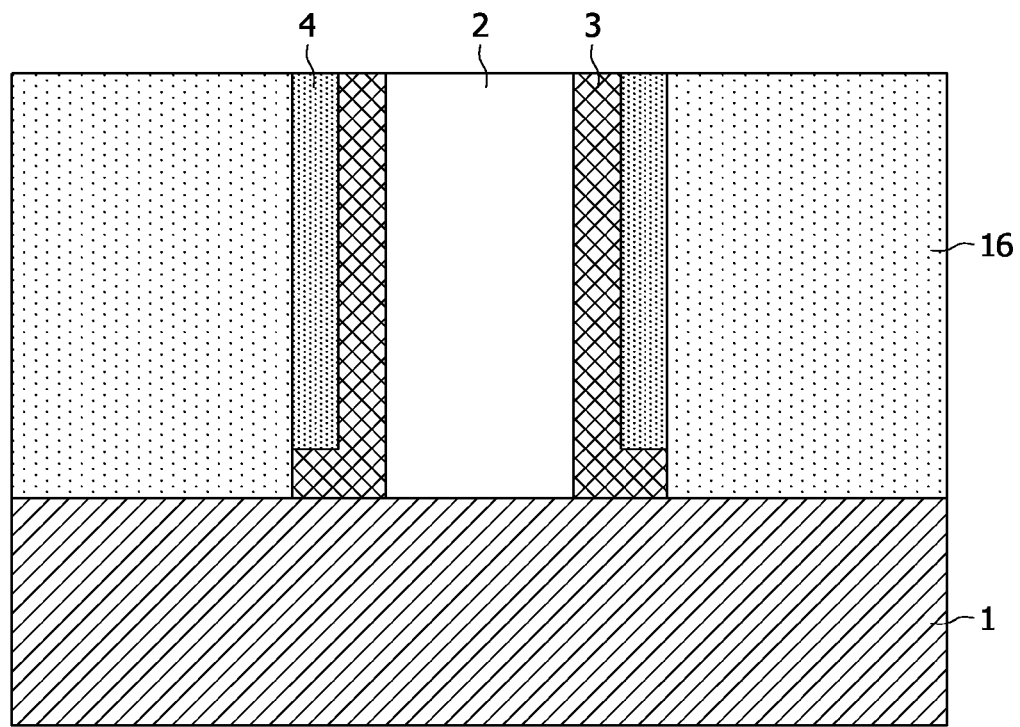

A first portion of the SiGe layer 3 covers the protrusion 2 and a first portion of the silicon layer 4 covers the first portion of the SiGe layer 3, a second portion of the SiGe layer 3 covers the substrate 1 and a second portion of the silicon layer 3 covers the second portion of the SiGe layer 3. As is illustrated in FIG. 2, these second portions may be removed with an etch-back process thereby leaving only a first portion of the SiGe layer 3 and a first portion of the silicon layer 4 on the protrusion 2. These second portions may alternatively be removed in a later stage of the fabrication of the device. Thereafter a silicon dioxide layer 16 is deposited after which Chemical Mechanical Polishing (CMP) is used to remove the silicon dioxide layer 16, the silicon layer 4 and the SiGe layer 3 thereby creating a planar surface and exposing the top surface of the protrusion 2 and a part of the SiGe layer 3. Etch-back techniques may also be used to remove the silicon layer 4 and the SiGe layer 3 to expose the top surface of the protrusion 2.

In case an SOI substrate is used (not shown in the drawings), the substrate 1 comprises a bulk silicon layer covered by a (buried) silicon dioxide layer and a silicon layer, and the silicon layer may be removed to expose the buried silicon dioxide layer, after which selective epitaxial growth is used to form the SiGe layer 3 and the silicon layer 4 on the protrusion 2. SiGe layer 3 and silicon layer 4 are not formed on the buried silicon dioxide layer because of the use of selective epitaxial growth.

As is illustrated in FIG. 3, an etch is performed that selectively removes the SiGe layer 3 with respect to the protrusion 2 and the silicon layer 4, thereby forming trenches 5 and fins 6, which comprise silicon. The width of the fins 6 is defined by the fabrication method wherein the silicon layer 4 is formed, in this case an epitaxial growth, and this width is substantially equal to the thickness of the silicon layer 4. The applied fabrication method is able to form a layer with a reproducible thickness smaller than 10 nanometer, hence the width of the fin 6 is also reproducibly smaller than 10 nanometer, which cannot be achieved with the fabrication method of the prior art. In this embodiment the protrusion 2 and the layer 4 are made of the same silicon material, and the layer 3 is made of SiGe, but also a combination of other semiconductor materials may be used. These materials should be such that at least a selective etching of the layer 3 with respect to the protrusion 2 and the layer 4 is feasible. At this point the fins 6 and the protrusion 2 may be provided with dopant atoms by using vapor-phase doping or plasma immersion doping, or any other dopant technique, thereby setting the dopant levels of the fins 6 to get an appropriate device performance. Furthermore, all exposed top and bottom surfaces may be implanted with a dopant to adjust their conductivity characteristics such that the fins 6 are the primary conducting path by reducing the influence of surface parasitic transistors on the device performance.

As is illustrated in FIG. 4, the exposed surfaces are oxidized, thereby forming a silicon dioxide layer 9, which functions as a gate oxide. Thereafter a polysilicon layer 7 is deposited on the silicon dioxide layer 9, thereby forming a gate electrode. The silicon dioxide layer 9 may also comprise another insulating layer, such as a high-k dielectric layer, and the polysilicon layer 7 may also comprise another conductive material, such as a metal or another material that can be used as a gate material. A rounded top portion of the protrusion 2 avoids the well-known corner-sharpening effect, which can cause a reduced integrity or a breakdown of silicon dioxide layer 2.

A dual-gate FET device may be created by patterning the polysilicon layer 7 after which source and drain regions are formed by implantation of portions of the fins 6 that are not covered by the patterned polysilicon layer 7, as is illustrated in FIG. 5, which is a schematic top view of this embodiment. The source and drain region may also comprise lightly doped drain and source regions, by forming spacers of an insulating material between the gate electrode and the source and drain region.

Another embodiment comprises the forming of a dual-gate FET with a plurality of fins and trenches and starts with the embodiment that is illustrated in FIG. 1, wherein, as is illustrated in FIG. 6, on the silicon layer 4 a SiGe layer 13 and a silicon layer 14 are formed using the same fabrication techniques that were used for forming the SiGe layer 2 and the silicon layer 4. The SiGe layers 3, 13 and the silicon layers 4, 14 have a first portion that covers directly or indirectly the protrusion 2 and a second portion that covers directly or indirectly the substrate 1. Alternatively more SiGe and silicon layers may be formed.

As is illustrated in FIG. 7, the second portions of the SiGe layers 3, 13 and the silicon layers 4, 14 may be removed with an etch-back process thereby leaving only the first portions of the SiGe layers 3, 13 and the silicon layers 4, 14 on the protrusion 2. These second portions may alternatively be removed in a later stage of the fabrication of the device. Also in this embodiment selective epitaxial growth in combination with an SOI substrate may be used to form the SiGe layers 3, 13 and the silicon layers 4, 14 only on the protrusion 2. Thereafter a silicon dioxide layer 16 is deposited and CMP is used to create a planar surface by removing the silicon dioxide layer 16, the silicon layers 4, 14 and the SiGe layers 3, 13 to expose the top surface of the protrusion 2 and a part of the SiGe layers 3, 13. Also other etch-back techniques may be used to expose the top surface of the protrusion 2 and a part of the SiGe layers 3, 13.

Referring to FIG. 8, an etch is performed which selectively removes the SiGe layers 3, 13 with respect to the protrusion 2 and the silicon layers 4, 14, thereby forming a plurality of trenches 5 and fins 6. Thereafter a dual-gate FET with a plurality of channels may be formed by creating and patterning a gate electrode and forming source and drain regions. This FET has a high current drive while occupying a smaller area than the FET in the prior art, because the pitch of the fins 6 is defined by epitaxial techniques and not by photolithographic techniques.

The fabrication of an asymmetrical dual-gate FET starts with the embodiment which is illustrated in FIG. 3. A silicon dioxide layer 19 is formed by thermal oxidation of the exposed surfaces, as is illustrated in FIG. 9. Also another insulating layer may be formed on the exposed surfaces, such as silicon nitride or a high-k dielectric layer. Subsequently a first conductive layer 17 comprising polysilicon is deposited on the silicon dioxide layer 19. The first conductive layer 17 may also comprise another conducting material, such as a metal or another material that can be used as a gate material. Thereafter the first conductive layer 17 is removed from the top surface of the fins 6 with an etch-back process thereby creating a first region of the first conductive layer 17 which is in the trenches 5 and a second region of the first conductive layer 17 which is in the regions outside the trenches 5, wherein the first and the second region of the first conductive layer 17 are disconnected. If the first conductive layer 17 comprises a metal, a lithographic mask may be used to remove the metal from the top surface of the protrusion 2.

Thereafter, as is illustrated in FIG. 10, a silicon nitride hard mask 8 is applied with an opening that at least partly covers a region between the fins 6 above the protrusion 2. Subsequently the protrusion 2, the silicon dioxide layer 19 that covers the surface of the trenches 5 and the first region of the first conductive layer 17 are removed thereby forming a space between the fins 6 and a first gate electrode 37. The hard mask 8 is used to prevent that the second region of the first conductive layer 17 is removed, thereby enabling the forming of the first gate electrode 37. This hard mask may be made of silicon nitride or any other material that can prevent that the first conductive layer 17 is removed. Next a silicon dioxide layer 29 is formed on the exposed surface of the fins 6 in the space, and subsequently a second conductive layer 28 comprising polysilicon or metal is deposited on the silicon dioxide layer 29 thereby forming a second gate electrode 27. In this embodiment the second gate electrode 27 comprises silicon dioxide and polysilicon or metal, and the first gate electrode 37 comprises silicon dioxide and polysilicon, however, also other combinations of materials may be applied with the restriction that gate electrodes are formed. Also the thickness of the insulating layers 19 and 29 may be different.

FIG. 11 is a diagrammatic top view of an embodiment in which the second gate electrode 27 is contacted on source and drain regions 10 and 20. After the step of removing the first conductive layer 17 from the top surface of the fins 6, the hard mask 8 is applied which, in this embodiment, does not provide an opening that covers at least a part of the region between the fins, but provides openings 91 and 92 on the source and drain regions 10 and 20. The protrusion 2, the first conductive layer 17 and the silicon dioxide layer 19 are removed by applying etchants via the openings 91 and 92, wherein the etching process is selective with respect to the other materials. Thereafter, the silicon dioxide layer 29 is formed on the exposed surface of the fins 6, using the openings 91 and 92 to supply the silicon dioxide layer 29 to the exposed surfaces of the fins 6. Subsequently the second conductive layer 28 comprising polysilicon is deposited on the silicon dioxide layer 29 via the openings 91 and 92 to form the second gate electrode 27. Next the openings 91 and 92 are used to form contacts to the second gate electrode 27. Alternatively the contact to the second gate electrode 27 may be placed in between the fins. The contacts to the first gate electrode 37 may be made using a conventional fabrication method, and may be located adjacent to the fins.

In summary, the invention provides a method of fabricating an extremely short-length dual-gate FET, using conventional semiconductor processing techniques, with extremely small and reproducible fins with a pitch and a width that are both smaller than can be obtained with photolithographic techniques. On a protrusion on a substrate, a first layer and a second layer are formed, after which the top surface of the protrusion is exposed. A portion of the first layer is selectively removed relative to the protrusion and the second layer, thereby creating a fin and a trench. Also a method is presented to form a plurality of fins and trenches. The dual-gate FET is created by forming a gate electrode in the trench(es) and a source and drain region. Further a method is presented to fabricate an extremely short-length asymmetric dual-gate FET with two gate electrodes that can be biased separately.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. A method for fabricating a dual-gate FET, comprising the steps of:
   forming a protrusion of a first semiconductor material on a substrate,
   forming a first layer of a first material on sidewalls and a top surface of the protrusion,
   forming a second layer of a second semiconductor material on the first layer,
   removing a first portion of the first layer on the top surface of the protrusion and a first portion of the second layer on the first portion of the first layer to expose the top surface of the protrusion,
   selectively removing a portion of the first material to a predetermined depth relative to the first and the second semiconductor material, to form a trench between the protrusion and the second layer, and to form a fin adjoining the trench, the fin formed from a portion of the second layer,
   forming an insulation layer on the exposed surfaces of the trench and the fin, and
   forming a layer of a conductive material on the insulation layer, thereby forming a gate electrode.

2. The method as claimed in claim 1, further comprising the steps of: forming at least one multi-layer structure comprising a layer of the first material and a layer of the second semiconductor material after forming of the second layer, the step of removing the first layer and the second layer further comprising the removal of the multi-layer structure, and the step of selectively removing the first material further comprising forming at least one trench between the layers of the second semiconductor material and at least one fin adjoining the trench.

3. The method as claimed in claim 1, wherein the forming of the first layer of the first material and the second layer of the second semiconductor material is realized by epitaxial growth.

4. The method as claimed in claim 1, further comprising the step of: providing dopant atoms to the first and the second semiconductor material after the selective removal of the first material.

5. The method as claimed in claim 1, further comprising the step of: providing a layer of implanted material in the bottom surface of the trench and the top surface of the protrusion, and the fin.

6. The method as claimed in claim 1, wherein the first material comprises SiGe and the second semiconductor material comprises silicon.

7. The method as claimed in claim 1, wherein the width of the fin is smaller than 10 nanometer.

8. The method as claimed in claim 1, further comprising the steps of: removing the protrusion, the first conductive layer which is in the trench and the first insulation layer which is in the trench, thereby forming a space between the fin and a first gate electrode, forming a second insulation layer on the exposed surfaces of the space, and forming a second conductive layer of a second conductive material on the second insulation layer, thereby forming a second gate electrode.

9. The method as claimed in claim 8, wherein before the step of forming the first insulation layer a source region and a drain region are formed, further comprising the steps of: forming at least one contact area on the source region or on the drain region, thereby forming an electrical connection to the second gate electrode.

10. The method as claimed in claim 8, wherein the first conductive material comprises metal and the second conductive material comprises polysilicon.

11. The method as claimed in claim 1, wherein a remaining portion of the first material defines the bottom of the trench.

12. A method for fabricating a dual-gate FET, the method comprising:
   forming a protrusion of a first semiconductor material on a substrate;
   forming a first layer of a first material on sidewalls and a top surface of the protrusion;
   forming a second layer of a second semiconductor material on the first layer;
   removing a portion of the first layer and a portion of the second layer to expose the top surface of the protrusion;
   selectively removing a portion of the first material to form a trench between the protrusion and a further portion of the second layer and to form a fin adjoining the trench, the fin formed from the further portion of the second layer and a remaining portion of the first material defining the bottom of the trench;
   forming an insulation layer on the exposed surfaces of the trench and the fin; and
   forming a layer of a conductive material on the insulation layer, thereby forming a gate electrode.

13. The method as claimed in claim 12, wherein selectively removing the portion of the first material to form the trench includes selectively removing portions of the first material on the sidewalls of the protrusion to form the trench and a further trench located between the protrusion and a third portion of the second layer, the further trench located on an opposite side of the protrusion from the trench, the third portion of the second layer forming a further fin, and a remaining portion of the first material defining the bottom of the further trench.

14. The method as claimed in claim 12, further comprising forming a third layer of the first material on the second layer and forming a fourth layer of the second semiconductor material on the third layer, wherein removing the portion of the first layer and the portion of the second layer to expose the top surface of the protrusion includes removing a first portion of the first layer on the top surface, removing a first portion of the second layer on the first portion of the first layer, removing a first portion of the third layer on the first portion of the second layer and removing a first portion of the fourth layer on the first portion of the third layer to expose the top surface of the protrusion.

15. The method as claimed in claim 14, wherein selectively removing the portion of the first material to form the trench includes selectively removing portions of the first material to form a plurality of trenches and a plurality of fins from portions of the second and fourth layers, ones of the trenches defined by the sidewalls of the protrusion and the fins with remaining portions of the first material defining the bottoms of the trenches.

16. The method as claimed in claim 15, further comprising forming the insulation layer on the exposed surfaces of the plurality of trenches and the plurality of fins.

17. The method as claimed in claim 15, wherein each of the plurality of fins has width smaller than 10 nanometers.